United States Patent [19]
Etoh et al.

[11] Patent Number: 5,455,797
[45] Date of Patent: Oct. 3, 1995

[54] REFERENCE VOLTAGE GENERATOR

[75] Inventors: Jun Etoh, Hachioji; Yoshinobu Nakagome, Hamura; Hitoshi Tanaka, Ome; Koji Kawamoto, Tottori; Masakazu Aoki, Tokorozawa, all of Japan

[73] Assignees: Hitachi, Ltd.; Hitachi ULSI Engineering Corporation, both of Tokyo, Japan

[21] Appl. No.: 317,736

[22] Filed: Oct. 4, 1994

Related U.S. Application Data

[62] Division of Ser. No. 170,724, Dec. 21, 1993, Pat. No. 5,384,740.

[30] Foreign Application Priority Data

Dec. 24, 1992 [JP] Japan .................................. 4-343808

[51] Int. Cl.⁶ ...................................................... G11C 7/00
[52] U.S. Cl. ................... 365/189.09; 365/189.01; 365/189.06; 365/226

[58] Field of Search ................. 365/189.09, 226, 365/227, 230.06, 189.07, 189.01; 323/313, 314, 315

[56] References Cited

U.S. PATENT DOCUMENTS

| | | | |
|---|---|---|---|
| 5,229,711 | 7/1993 | Inoue | 323/313 |
| 5,384,740 | 1/1995 | Etoh et al. | 365/189.09 |

*Primary Examiner*—Joseph A. Popek
*Assistant Examiner*—Tan Nguyen
*Attorney, Agent, or Firm*—Antonelli, Terry, Stout & Kraus

[57] ABSTRACT

An apparatus includes a constant voltage generator for generating a voltage based on a difference between threshold voltages of two MOS transistors, and a voltage sampling device for sampling the output voltage of the constant voltage generator circuit, wherein the voltage sampling device samples the output voltage of the constant voltage generator before an electric source switch for the constant voltage generator is turned off.

10 Claims, 7 Drawing Sheets

REFERENCE VOLTAGE GENERATOR

This application is a Division of application Ser. No. 08/170,724, filed Dec. 21, 1993, now U.S. Pat. No. 5,384,140.

BACKGROUND OF THE INVENTION

The present invention relates to a reference voltage generator integrated on a semiconductor integrated circuit.

A large number of portable equipments using LSI as represented by a notebook type personal computer have been produced in recent years. In such portable equipments, the discharging time of a battery has become important. It is therefore important to reduce the power dissipation of LSI used in portable equipments. Recently, DRAMs have been used in such portable equipments as a storage device substituting for a floppy disk or a hard disk, and power reduction of DRAMs is required. Particularly in DRAM, power reduction of a reference voltage generator and a substrate bias voltage circuit is important because they consume power constantly.

A circuit disclosed in JP-A 1-296491 is an example of the reference voltage generator. This circuit generates a reference voltage in accordance with the threshold voltage difference between the MOS-FETs. In this circuit, the value of the reference voltage changes in accordance with variation of threshold voltage, but the influence thereof decreases as the operation current increases. Further, as the operation current increases, the influence of noise from a substrate decreases.

SUMMARY OF THE INVENTION

Accordingly, the conventional reference voltage generator has a problem in that generation of a high-accurate and high-stable reference voltage is incompatible with reduction of consumed electric power.

It is therefore an object of the present invention to provide a reference voltage generator which is not only excellent in accuracy and noise immunity but small in consumed electric power.

Figure 1:
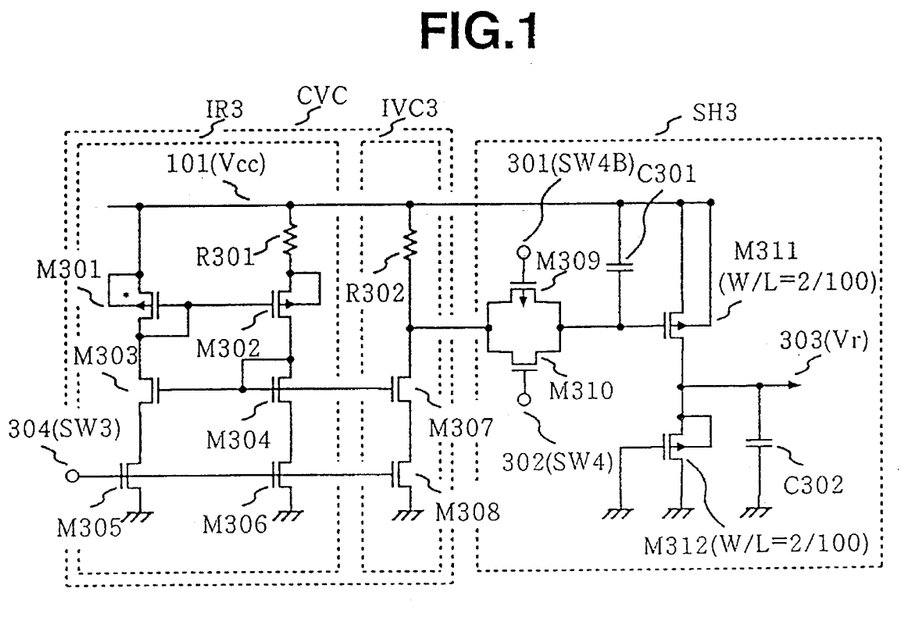
FIG. 1 is a diagram of a pulse-driven reference voltage generator according to the present invention.

To achieve the foregoing object, the present invention shows a reference voltage generator comprising:

a constant voltage generator (CVC) coupled between a first operation potential (Vcc) and a second operation potential (GND); and a voltage sampling means (SH3) for sampling an output voltage of the constant voltage generator (CVC);

wherein the constant voltage generator (CVC) includes:
first and second MOS transistors (M301, M302); and
a first switching means (M305, M306) coupled between the first operation potential (Vcc) and the second operation potential (GND) so as to be connected in series to respective source-drain paths of the first and second MOS transistors (M301, M302);

wherein the constant voltage generator (CVC) serves to output, at a first output terminal, a first voltage proportional to a difference between threshold voltages of the first and second MOS transistors (M301, M302);

wherein the voltage sampling means (SH3) includes:
a second switching means (M309, M310) having one end coupled with the first output terminal of the constant voltage generator (CVC); and
a first capacitor (C301) coupled to the other end of the second switching means (M309, M310) to thereby store the first voltage of the constant voltage generator (CVC);

wherein after the first capacitor (C301) of the voltage sampling means (SH3) is charged with the first voltage of the constant voltage generator (CVC), the second switching means (M309, M310) of the voltage sampling means (SH3) is turned off and then the first switching means (M305, M306) of the constant voltage generator (CVC) is turned off to thereby reduce a current consumed by the constant voltage generator (CVC) (see FIG. 1).

Because the constant voltage generator (CVC) generates a voltage proportional to a difference between threshold voltages of the first and second MOS transistors (M301, M302), the current consumed is very large. In the present invention, however, the amount of power dissipation of the constant voltage generator can be reduced while the reference voltage output is maintained.

Further, the first switching means (M305, M306) of the constant voltage generator (CVC) is turned on periodically. The second switching means (M309, M310) of the voltage sampling means (SH3) is turned on when the first switching means (M305, M306) of the constant voltage generator (CVC) is on, so that the first capacitor (C301) of the voltage sampling means (SH3) restores the first voltage of the constant voltage generator (CVC).

As a result, the voltage sampled by the voltage sampling means (SH3) is refreshed periodically so that a desired voltage can be always outputted.

In addition, the reference voltage generator according to the present invention is applied to dynamic random access memory, by which voltages supplied to respective gates of MOS transistors in DRAM memory cells can be controlled accurately.

DESCRIPTION OF THE PREFERRED EMBODIMENTS

First Embodiment

An embodiment of a reference voltage generator according to the present invention will be described with reference to FIG. 1.

FIG. 1 shows an embodiment of a reference voltage generator according to the present invention.

The reference voltage generator comprises a constant voltage generator CVC to generate a voltage in accordance with the threshold voltage difference between the MOS-FETs, and a voltage sampling circuit SH3 for sampling an output voltage of the constant voltage generator CVC. The constant voltage generator CVC includes a current source IR3, and a current-voltage converter IVC3.

In this embodiment, after the output voltage of the constant voltage generator CVC is sampled by the voltage sampling circuit SH3, current supply to the constant voltage generator CVC is stopped to thereby attain reduction of electric power consumption.

The detailed operation of the circuit of FIG. 1 will be described below.

In the drawing, MOS-FETs accompanied by the arrow represent P-channel MOS-FETs (hereinafter referred to as "PMOS"), and MOS-FETs not accompanied by the arrow represent N-channel MOS-FETs (hereinafter referred to as "NMOS").

MOS-FETs M305 and M306 in the current source IR3 and an MOS-FET M308 in the current-voltage converter IVC3 constitute a switch for controlling the operation and non-operation of these circuits. MOS-FETs M309 and M310 in the voltage sampling circuit constitute a switch for connecting the constant voltage generator and the voltage sampling circuit.

The current source IR3 operates as follows. The rate W/L of channel width W to channel length L in M301 is equal to the rate W/L in M302. The threshold voltage of M301 is higher than that of M302. The ratio of channel width W to channel length L (that is, W/L) in M303 is equal to the ratio W/L in M304. The conductance in M305, M306 is sufficiently larger than the conductance in the aforementioned MOS-FETs M301 to M304. In the condition in which the MOS-FETs M305 and M306 are on, the MOS-FETs M301 to M304 operate in saturation regions. When the MOS-FETs M305 and M306 are turned on, same amount of current flows in the MOS-FETs M303 and M304 because the gate-source voltage of the MOS-FET M303 is equal to that of the MOS-FET M304. Accordingly, same amount of current flows in the MOS-FETs M301 and M302. When the gate-source voltages of the MOS-FETs M301 and M302 and the resistance value of a resistor R301 in this occasion are replaced by Vt1, Vt2 and R1 respectively, the current flowing in the resistor R301 is expressed by $(Vt1-Vt2)/R1$.

The current-voltage converter IVC3 operates as follows. When the MOS-FET M308 is on, the MOS-FET M307 operates in a saturation region. Because the MOS-FETs M304 and M307 constitute a current mirror circuit, the current flowing in the MOS-FET M307 is expressed by $((Vt1-Vt2) \cdot S7)/(S4 \cdot R1)$ when the ratio W/L in M307 and the ratio W/L in M304 are replaced by S7 and S4 respectively. Accordingly, the voltage drop in the resistor R302 is expressed by $((Vt1-Vt2) \cdot S7 \cdot R2)/(S4 \cdot R1)$ when the resistance value of R302 is replaced by R2. This voltage constitutes a reference voltage Vr. Because the size of the reference voltage is determined on the basis of the threshold voltage difference, W/L and resistance rate, the reference voltage is little influenced by the variation in fabrication processes, the change of power supply voltage and the change of temperature.

The voltage sampling circuit SH3 operates as follows. The W/L in M311 is equal to the W/L in M312. The MOS-FETs M311 and M312 operate in saturation regions. When the MOS-FETs M309 and M310 are turned on, the output voltage of the constant voltage generator, that is, the reference voltage Vr, is applied to the capacitor C301. When the MOS-FETs M309 and M310 are then turned off, the reference voltage Vr is stored in the capacitor C301. At this point of time, the reference voltage Vr is a voltage based on the power supply potential. The reference voltage stored in C301 is converted to the voltage across C302 as follows. The reference voltage stored in C301 becomes a gate-source voltage of M311, so that a current in accordance with this voltage flows in M311. Similarly, a current of the same value flows in M312. Because the W/L in M311 is equal to the W/L in M312, the gate-source voltage of M312 becomes equal to Vr. Accordingly, the reference voltage Vr appears between opposite ends of the capacitor C302. As a result, the reference voltage Vr based on the power supply potential is picked up as a reference voltage Vr based on the ground potential.

Figure 2:
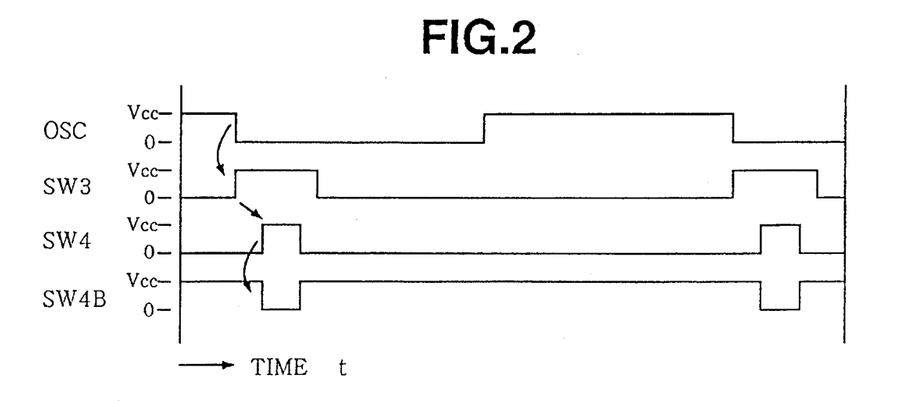
FIG. 2 is a time chart showing pulse signals for controlling the operation of the reference voltage generator according to the present invention.

Referring next to the time chart of FIG. 2, the detailed operation of the reference voltage generator will be described. Signal OSC is an output signal of an oscillation circuit. For example, a ring oscillator using an inverter constituted by MOS-FETs is used as the oscillation circuit. Respective circuits constituting the reference voltage generator operate in synchronism with the output signal of this circuit. Signals SW3, SW4 and SW4B are signals synchronized with the signal OSC.

When the level (potential) of the output signal OSC of the oscillation circuit becomes low, the level of the signal SW3 becomes high. As a result, the MOS-FETs M305, M306 and M308 in the constant voltage generator in FIG. 1 are turned on, so that the current source and the current-voltage converter operate. As a result, the reference voltage Vr appears between the opposite ends of the resistor R302 in the current-voltage converter. With the passage of a predetermined time after the point of time when the level of the signal SW3 becomes high, the level of the signal SW4 and the level of the signal SW4B become high and low respectively. This delay time is determined on the basis of the period of from the point of time when the operations of the current source and the current-voltage converter are started to the point of time when the voltage Vr appears between the opposite ends of the resistor R302. By turning the level of the signal SW4 and the level of the signal SW4B to a high level and a low level respectively, the MOS-FETs M309 and M310 are turned on. Accordingly, the voltage between the opposite ends of the capacitor C301 becomes equal to Vr. As a result, the gate-source voltage of M311 becomes equal to Vr. As a result, Vr appears between the gate and the source of M312 and between the opposite ends of the capacitor C302. Thereafter, the levels of the signals SW4 and SW4B become low and high respectively, so that the MOS-FETs M309 and M310 are turned off. The time during which the levels of the signals SW4 and SW4B are high and low respectively is determined on the basis of the time required for charging the capacitor C301 with the reference voltage Vr sufficiently, so that the reference voltage Vr is stored in the capacitor C301. Then, the level of the signal SW3 becomes low, so that the current source and the current-voltage converter become inoperative and the level of the signal OSC becomes high. When the signal OSC then becomes low in level, the same operation as above is carried out. Thus, the operation and non-operation of the constant voltage generator are repeated periodically.

The reason why the constant voltage generator is operated periodically is as follows.

(1) The reference voltage Vr generated by the constant voltage generator CVC is stored in the capacitor C301. The reference voltage Vr stored in the capacitor C301 is lowered because of leak current. Therefore, when the reference voltage is lowered so as to be out of an allowable range, a new reference voltage is generated by the constant voltage generator CVC so that the capacitor C301 can be charged with the new reference voltage.

(2) The reference voltage stored in the capacitor C301 can be always picked up through M311 and M312 regardless of the operation or non-operation of the constant voltage generator CVC.

Because the period during which the operation current of the constant voltage generator flows is shortened when the constant voltage generator is operated periodically in the aforementioned manner, consumed electric power can be reduced without reduction of the current at the time of the operation of the constant voltage generator. Further, because the reference voltage can be generated without reduction of the current at the time of the operation of the constant voltage generator, a high-accurate reference voltage can be generated. Further, because it is unnecessary to reduce the current at the time of the operation of the constant voltage generator, there is no necessity of increasing the resistance values of resistors used in these circuits. In DRAM process, a resistor is generally constituted by a diffusion layer or a polysilicon layer so that the sheet resistivity thereof is from $50\Omega$ to $100\Omega$. Accordingly, when a high resistance is to be produced by using these layers, the layout area becomes very large. Because the resistance used in the reference voltage generator of this embodiment can be set to be low as described above, the increase of chip size can be suppressed.

The capacitor C302 is provided for the purpose of reducing the output impedance of the reference voltage generator to suppress the change of the reference voltage caused by noise transmitted through capacitive coupling or the like.

The period of the signal OSC for controlling the operation of the reference voltage generator is determined as follows. The reference voltage Vr stored in the capacitor C301 changes in accordance with current leaking in the pn junction. This mechanism is the same as the mechanism of leaking of electric charges stored in a memory cell. Therefore, the reference voltage Vr is supplied to the capacitor C301 in a period equal to or slightly shorter than the refresh period of the memory cell. That is, the period of the signal OSC is selected to be equal to or slightly shorter than the refresh period of the memory cell. In the case of a chip including a memory refresh control circuit, the reference voltage generator may be controlled on the basis of a signal generated by the memory refresh control circuit, instead of the signal OSC. In the reference voltage generator, the current source IR3 and the current-voltage converter IVC3 operate substantially only in the memory cell refresh period, so that the quantity of consumed electric power becomes very small. When, for example, the time during which the potential of SW3 is high is about 50 ns in the condition in which the memory cell refresh interval is 15.6µs, the quantity of electric power consumed by the constant voltage generator is reduced to about 1/300 times compared with the case where this circuit operates continuously. Accordingly, the time for discharging the battery can be elongated even in the case where DRAM (or the like) using the reference voltage generator according to the present invention is used in portable equipment.

Second Embodiment

Figure 3:
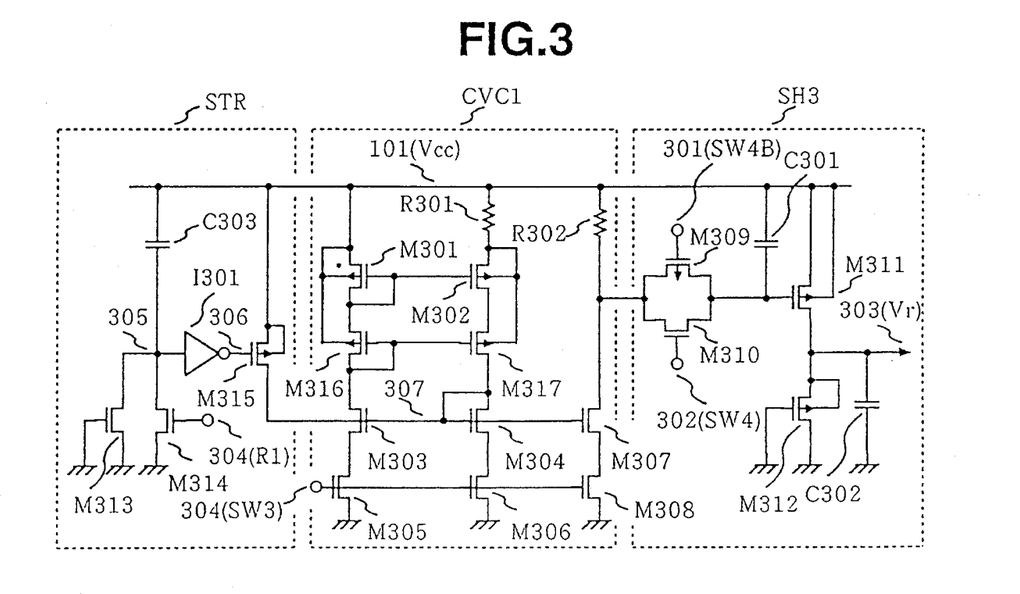
FIG. 3 is a diagram of another embodiment of the pulse-driven reference voltage generator.

Another embodiment of the present invention will be described with reference to FIG. 3. This embodiment is formed by adding a start-up circuit STR and MOS-FETs M316 and M317 to the current source depicted in FIG. 1. The current source depicted in FIG. 1 has two stable states. One is a state in which a current as designed flows, and the other is a state in which no current flows. When such a state in which no current flows is established, the reference voltage Vr becomes zero because the voltage drop in R302 becomes zero. It is therefore necessary to stabilize the current source in a state in which a current as designed flows. The start-up circuit STR serves to make a current flow in the current source. That is, at the time of application of power supply voltage, the potential of the terminal 305 is increased to a high level by the capacitor C303. The conductance of M313 is set in a small value in advance. Further, M314 is in an off state because the potential of the signal R1 is low. When the potential of the terminal 305 becomes high, the potential of the terminal 306 is turned to a low value by an inverter I301. As a result, M315 is turned to an on state, so that the potential of the terminal 307 is turned to a high level. Accordingly, M303 and M304 are turned on, so that a current begins to flow in the current source. In this occasion, the state of M305 and M306 is kept in an on state by the signal SW3. Thereafter, the potential of the terminal 305 is lowered by electric discharge through M313. Accordingly, the potential of the terminal 306 becomes high, so that M315 is turned off. Thereafter, M303 and M304 operate as a current mirror circuit. Further, the potential of the signal R1 becomes high, so that the potential of the terminal 305 becomes low securely. As described above, by providing a start-up circuit STK additionally, the current source can be securely stabilized to a state in which a current as designed flows.

In the current source depicted in FIG. 1, PSRR characteristic deteriorates as the drain conductance of P-channel MOS increases. The drain conductance of MOS-FET increases as the channel length thereof decreases. Accordingly, if the current source is constituted by micro devices, PSRR characteristic deteriorates. Therefore, when P-channel MOS-FETs M316 and M317 are disposed as shown in FIG. 3, the drain conductance is reduced equivalently. As a result, there is no deterioration of PSRR characteristic even in the case where the current source is constituted by micro devices.

Third Embodiment

Figure 4:
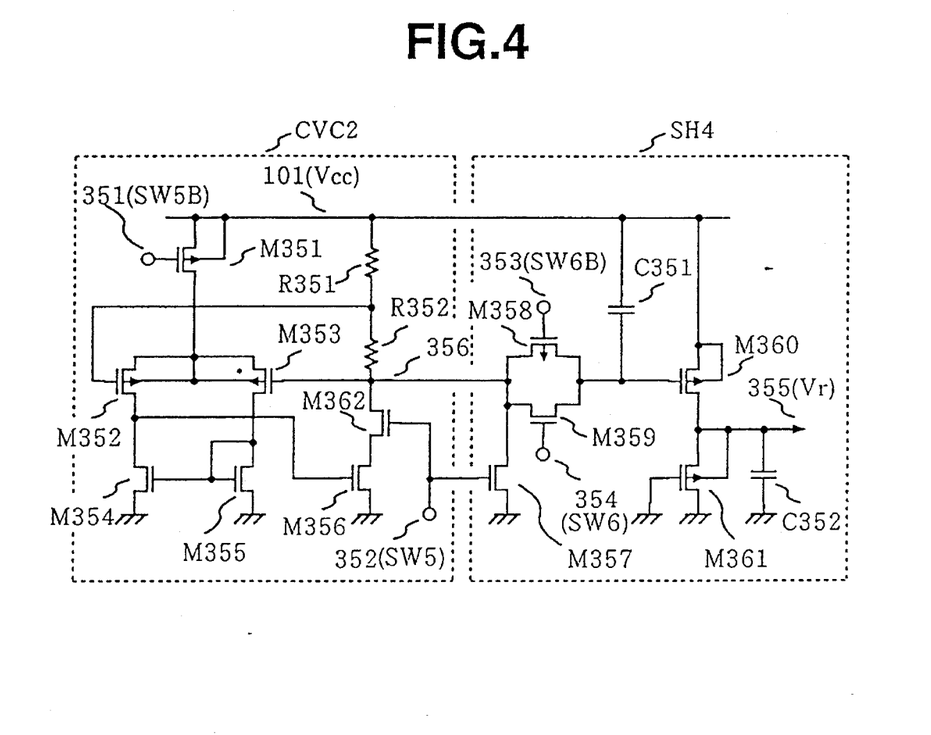
FIG. 4 is a diagram of a further embodiment of the pulse-driven reference voltage generator.

A further embodiment of the present invention will be described with reference to FIG. 4. FIG. 4 is the same as FIG. 1 in the point in which a voltage is outputted in accordance with the threshold voltage difference between two transistors. In the embodiment of FIG. 1, however, the constant voltage generator comprises a constant current source and a current-voltage converter. In this embodiment, these circuits are united into one body. The constant voltage generator CVC2 is constituted by MOS-FETs M351 to M356 and M362 and resistors R351 and R352. The voltage sampling circuit SH4 is the same as the circuit depicted in FIG. 1.

The operation of the constant voltage generator CVC2 is as follows. The rate W/L of channel width W to channel length L in M354 is equal to the rate W/L in M355. The W/L in M352 is equal to the W/L in M353. The threshold voltage of M353 is higher than that of M352. The conductance in M351 is larger than the conductance in the aforementioned transistors. In the condition in which the MOS-FETs M351 and M362 are on, the MOS-FETs M352 to M356 operate in saturation regions. Currents of the same value flow in the MOS-FETs M354 and M355 because the gate-source voltage of the MOS-FET M354 is equal to that of the MOS-FET M355. Accordingly, currents of the same value flow in the MOS-FETs M352 and M353. When the gate-source voltages of the MOS-FETs M352 and M353 in this occasion are replaced by Vt52 and Vt53 respectively, a voltage expressed by (Vt53–Vt52) is applied to the resistor R352. When the resistance value of a resistor R351 and the resistance value of the resistor R352 are replaced by R51 and R52 respectively, a current expressed by (Vt53–Vt52)/R52 flows in the resistor R352. Accordingly, the voltage between the terminals 101 and 356 is expressed by ((Vt53–Vt52)·(R51+R52))/R52. This voltage constitutes a reference voltage Vr. Because the size of the reference voltage Vr is determined on the basis of the threshold voltage difference and resistance rate, the reference voltage Vr is little influenced by the variation in processing, the change of power supply voltage and the change of temperature. The operation of the voltage sampling circuit is the same as that in the embodiment shown in FIG. 1. Further, an MOS-FET M357 is provided for the purpose of stabilizing the state of the constant voltage generator CVC2 speedily. That is, when the potential of the signal SW5B is turned to a low level, the potential of the signal SW5 is turned to a high level to thereby make a current flow through the resistors R351 and R352 and the MOS-FET M357. As a result, the constant voltage generator CVC2 is turned to a stable state speedily. With the passage of a certain delay time after the potential of the signal SW5 is turned to a high level, the MOS-FET M356 is turned on. Because the conductance of M357 is set to be smaller than that of the series-connection circuit of M362 and M356, a current flows mainly through M362 and M356 after M356 is turned on.

Figure 5:
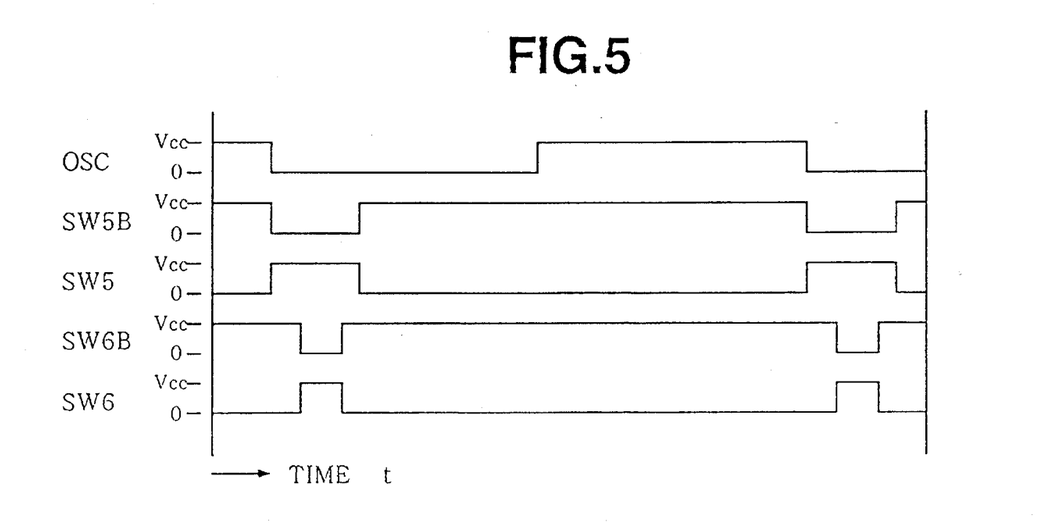
FIG. 5 is a time chart showing another example of pulse signals for controlling the operation of the reference voltage generator.

Referring next to the time chart of FIG. 5, the detailed operation of the reference voltage generator will be described. Like FIG. 2, when the potential of the output signal OSC of the oscillation circuit becomes low, the potential of the signal SW5B and the potential of the signal SW5 become low and high respectively. As a result, the constant voltage generator CVC2 operates so that the reference voltage Vr appears between the terminals 101 and 356. After a predetermined time, the potential of the signal SW6B and the potential of the signal SW6 become low and high respectively. As a result, MOS-FETs M358 and M359 are turned on, so that the voltage between the opposite ends of the capacitor C351 becomes equal to Vr. At the same time, the gate-source voltages of M360 and M361 become equal to Vr, so that Vr appears between the terminal 355 and the ground terminal. Thereafter, the potential of the signal SW6B and the potential of the signal SW6 become high and low respectively, so that the reference voltage Vr is stored in the capacitor C351. Then, the potential of the signal SW5B and the potential of the signal SW5 become high and low respectively, so that the constant voltage generator CVC2 is turned to an inoperative state. Thereafter, the potential of the signal OSC becomes high. When the potential of the signal OSC then becomes low, the same operation as described above is repeated.

Fourth Embodiment

Figure 6:
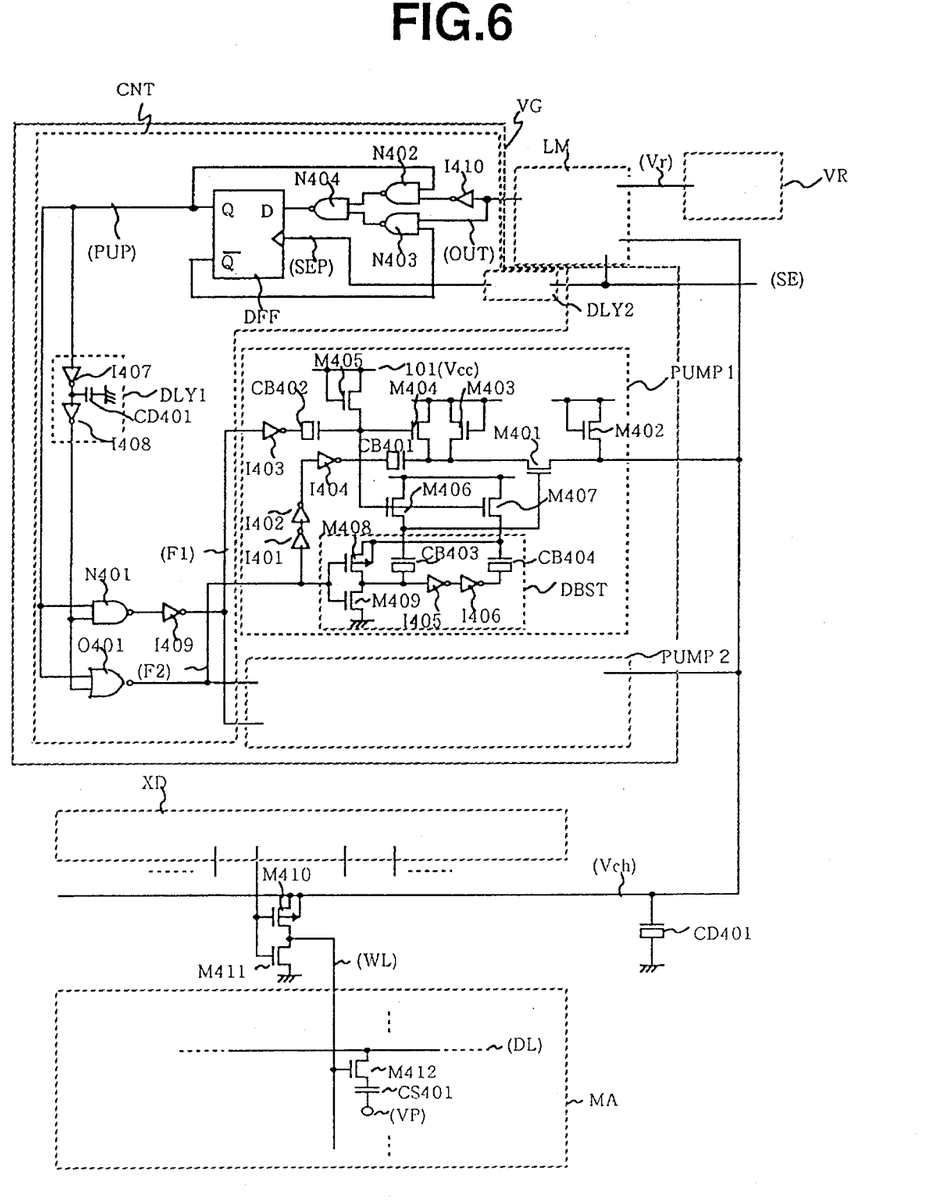
FIG. 6 is a diagram showing an example in which the reference voltage generator is used in a word line level control circuit of DRAM.

Referring next to FIG. 6, an example in which the output voltage of the reference voltage generator according to the present invention is used in a circuit for monitoring the word line voltage level of DRAM will be described.

In the drawing, VR designates a reference voltage circuit; LM designates a level monitoring circuit; VG designates an up converted voltage generator for generating a word line voltage Vch; MA designates a DRAM cell array which is constituted by a plurality of word lines WL, a plurality of data lines DL, MOS transistors disposed in intersections of the word and data lines, and a plurality of memory cells formed of capacitors; and XD designates an X decoder for selecting a desired word line from the plurality of word lines WL in the cell array.

FIG. 6 shows a circuit in which the output voltage Vr of the reference voltage generator VR and the word line voltage Vch of DRAM are compared by the level monitoring circuit LM so that the word line voltage generator VG generates a voltage Vch up-converted from the power supply voltage Vcc in accordance with the output signal of the level monitoring circuit LM.

The word line voltage generator VG operates as follows. In the drawing, PUMP1 and PUMP2 in the word line voltage generator VG designate up-converters, and CNT designates a control signal generator for generating control signals for PUMP1 and PUMP2. DLY in the control signal generator CNT designates a delay circuit for delaying a level monitor activating signal SE, and DFF designates a D-type flip-top.

First, the control signal generator CNT generates complementary signals F1 and F2 to the up-converters PUMP1 and PUMP2 respectively in accordance with the output signal of the level monitoring circuit LM. The up-converters PUMP1 and PUMP2 operate alternately in accordance with the complementary signals F1 and F2. These circuits generate a higher voltage Vch than the power supply voltage Vcc by transferring electric charges stored in the capacitor CB401 to CD401 through M401. To control the value of the output voltage Vch of the word line voltage generator VG, the periods of the signals F1 and F2 may be controlled.

The output Vch of the word line voltage generator VG serves to drive a word line through the X decoder XD selecting a word line driver constituted by M410 and M411. To set the voltage stored in a memory cell capacitor CS401 to be substantially equal to the power supply voltage Vcc, the word line voltage Vch be set so as to be larger by the threshold voltage Vth of a memory cell MOS transistor M412 than the power supply voltage Vcc.

Figure 7:
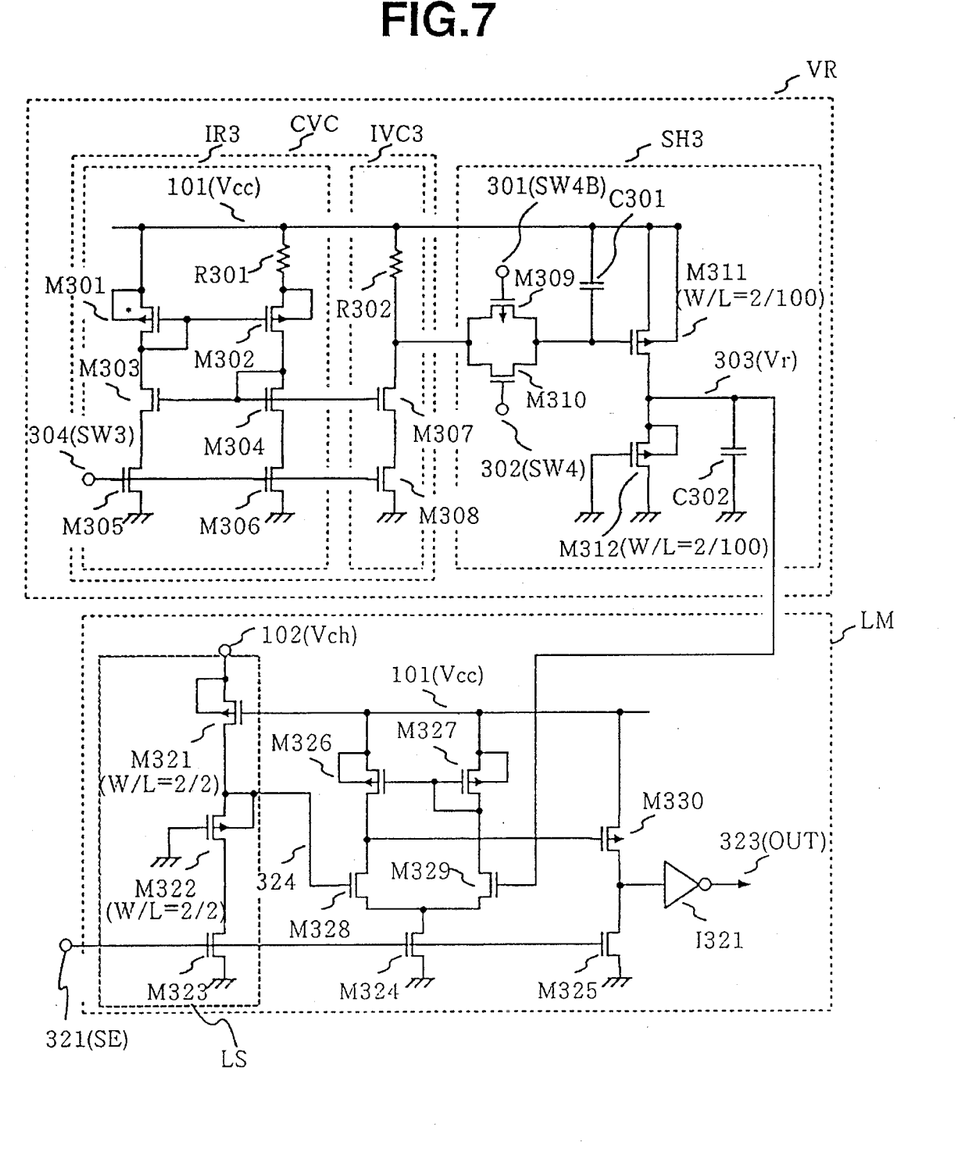
FIG. 7 is a diagram showing an example of the pulse-driven reference voltage generator used in a word line level control circuit of DRAM, and a word line level monitoring circuit.

Referring to FIG. 7, the reference voltage generator VR and the level monitoring circuit LM depicted in FIG. 6 will be described in detail. The reference voltage generator VR is the same as the reference voltage generator depicted in FIG. 1. MOS-FETs M323 to M325 in the level monitoring circuit LM constitute a switching circuit. MOS-FETs M321, M322 and M323 constitute a level shift circuit LS. MOS-FETs M326–M330, M324 and M325 constitute a differential amplifier. In the level shift circuit LS, the W/L in M321 is equal to the W/L in M322. The level monitoring circuit LM operates as follows. In the condition in which M323, M324 and M325 are on, the other transistors operate in saturation regions. Because the gate-source voltage of M321 is Vch-Vcc, the gate-source voltage of M322 becomes equal to Vch-Vcc. Accordingly, the voltage at an input terminal 324 of the differential amplifier becomes equal to Vch-Vcc. The other input terminal of the differential amplifier is supplied with the reference voltage Vr. Here, Vch-Vcc and Vr are compared, so that a result of the comparison is supplied to a gate of a transistor M330. When Vch-Vcc becomes larger than Vr (Vch>Vcc+Vr), the input level of the gate of the transistor M330 becomes low so that the potential of the output terminal 323 of the level monitoring circuit becomes low. Here, the conductance of M330 is sufficiently larger than the conductance of M325. On the contrary, when Vch-Vcc is lower than Vr (Vch<Vcc+Vr), the potential of the terminal 323 becomes high. Accordingly, the voltage Vch to be discriminated can be determined by adjusting the size of Vr.

Figure 8:
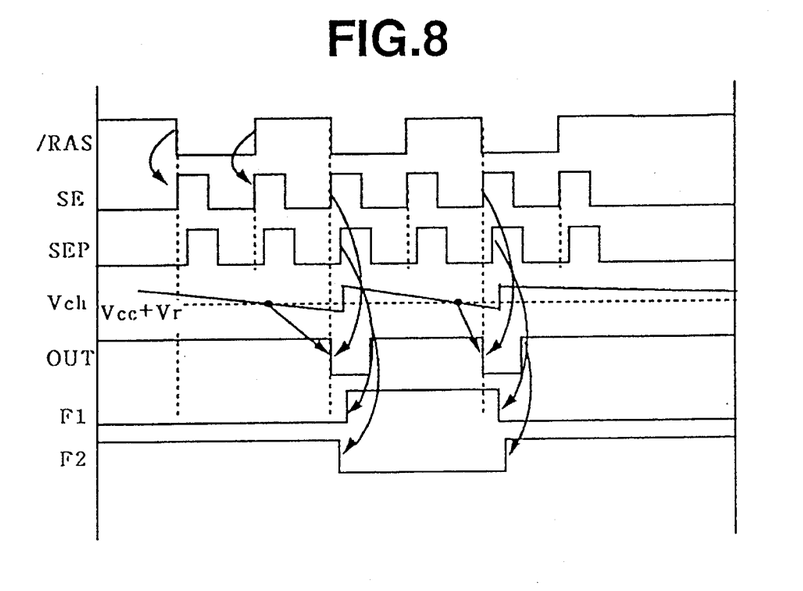
FIG. 8 is a time chart showing pulse signals for driving the word line level control circuit and the reference voltage generator.

Referring to FIG. 8, the operation of the control signal generator CNT will be described below.

Assume first the case where Vch is lower than Vcc+Vr. When the level monitor activating signal SE is supplied in synchronism with the falling of /RAS as described above, the output OUT of the level monitor is turned to a high potential. Then, the output of an NAND gate N404 is turned to an inversion level of the output Q of the D-type flip-flop DFF. When a signal SEP delayed for a short time from SE by the delay circuit DLY2 is then supplied to the clock input terminal of DFF, the inversion level is transmitted to the output of DFF at the rising edge of the signal SEP. That is, the potential of the output Q of DFF is inverted. When, for example, the output potential of DFF changes from a high level to a low level, the potential of F1 changes from a high level to a low level whereas the potential of F2 changes from a low level to a high level. As a result, PUMP2 in the up-converters PUMP1 and PUMP2 carries out up-conversion of the voltage. Next, a case where Vch is higher than Vcc+Vr is assumed. In this case, the potential of the output OUT of the level monitor becomes low. As a result, the NAND gate N404 outputs a potential equal to the potential of the output Q of DFF. Accordingly, the output of DFF does not change even in the case where the signal SEP rises. Accordingly, both the up-converters PUMP1 and PUMP2 stop the operations of outputting up-converted voltages. By repeating the aforementioned operations, the circuit of this embodiment can keep Vch near Vcc+Vr, and by setting Vr=Vth in FIG. 6, the word line voltage Vch can be kept near Vcc+Vth. Although FIG. 8 shows the case where the level monitor activating signal SE is generated while the level of the potential of the signal /RAS changes from high to low, this is because it is considered that the word line drive high voltage Vch may be used in a data line pre-charge circuit. In the case where the voltage Vch is not used in the data line pre-charge circuit, the level monitor activating signal SE may be generated only when the potential of /RAS changes from a high level to a low level. When the word line drive high voltage Vch is used in a gate drive circuit of an output buffer, the signal SE may be generated in synchronism with a column address strobe signal /CAS of DRAM.

Figure 9:
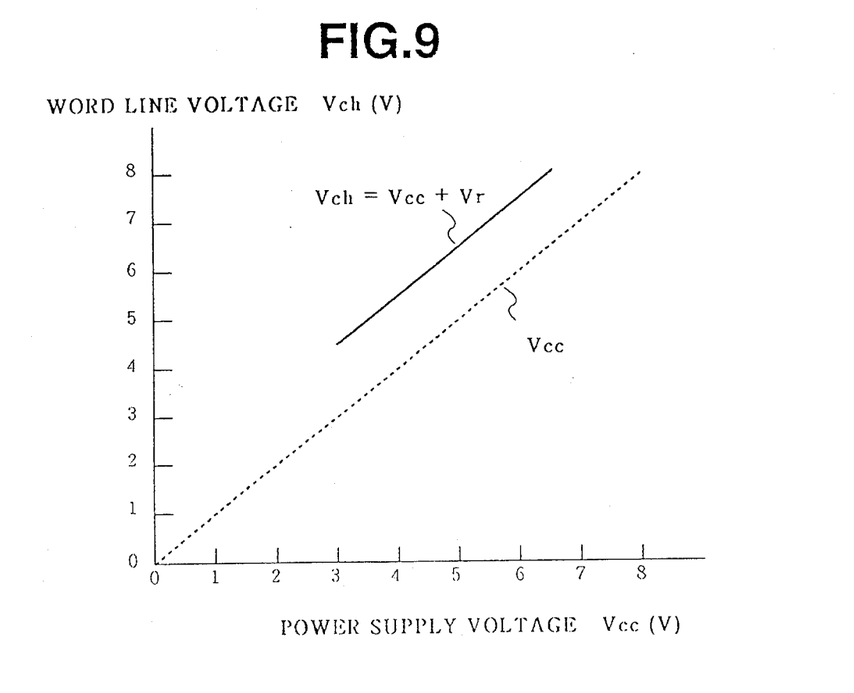
FIG. 9 is a graph showing the relationship between power supply voltage and word line voltage.

Referring to FIG. 9, there is shown the relationship between the word line voltage Vch obtained by the word line level control circuit and the power supply voltage. In this embodiment, the difference between Vch and Vcc can be made Vr accurately. Consequently, because the voltage applied to the gate of the MOS-FET of the memory cell can be controlled exactly, the gate breakdown caused by an excessive voltage can be prevented. Because the reference voltage generator according to the present invention can be operated independently of the operation of DRAM and substantially at refresh intervals of the memory cell, reduction of electric power consumed by DRAM is attained by using the reference voltage generator in a circuit for controlling the voltage level of word line of DRAM.

Fifth Embodiment

Figure 10:
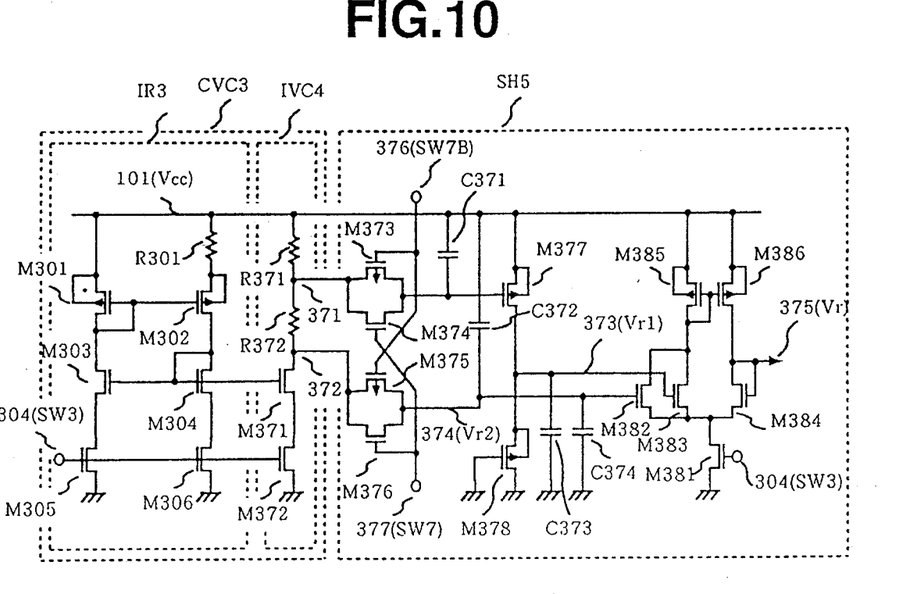
FIG. 10 is a diagram of a further embodiment of the pulse-driven reference voltage generator.

Referring to FIG. 10, a further embodiment of the present invention will be described. The reference voltage generator in FIG. 10 is substantially equal in circuit structure and operation to the reference voltage generator in FIG. 1, except that (1) two reference voltages are generated by a current-voltage converter, and (2) higher one selected from the two reference voltages is outputted. In the drawing, IR3 designates a current source which is the same as the current source in the reference voltage generator depicted in FIG. 1. IVC4 designates a current-voltage converter for generating two reference voltages. SH5 designates a voltage sampling circuit for sampling the two reference voltages. A circuit constituted by transistors M381 to M386 is a circuit for outputting higher one of the two input voltages Vr1 and Vr2 as Vr. The reference voltage generator operates as follows. The waveforms of pulse signals for controlling the operation of the reference voltage generator are the same as those of pulse signals for controlling the reference voltage generator depicted in FIG. 1. When the potential of the signal SW3 is turned to a high level, the current source IR3 and the current-voltage converter IVC4 operate. A current generated by the current source IR3 flows in resistors R371 and R372 through a current mirror circuit constituted by transistors M304 and M371. As a result, two reference voltages appear between terminals 101 and 371 and between terminals 101 and 372 respectively. Assume now that the voltage between the terminals 101 and 371 and the voltage between the terminals 101 and 372 are replaced by Vr1 and Vr2 respectively. After a predetermined time, the potential of the signal SW7 and the potential of the signal SW7B become high and low respectively. As a result, the voltages Vr1 and Vr2 are supplied to capacitors C371 and C372 respectively. Thereafter, the potential of the signal SW7 and the potential of the signal SW7B become low and high respectively, so that the voltages Vr1 and Vr2 are stored in the capacitors C371 and C372 respectively. Then, the potential of the signal SW3 becomes low, so that the current source IR3 and the current-voltage converter IVC4 are turned off. The two reference voltages are picked up as follows. Because the W/L in M377 is equal to the W/L in M378, the reference voltage Vr1 is a voltage obtained on the basis of the ground potential in the same manner as in the embodiment shown in FIG. 1.

Figure 11:
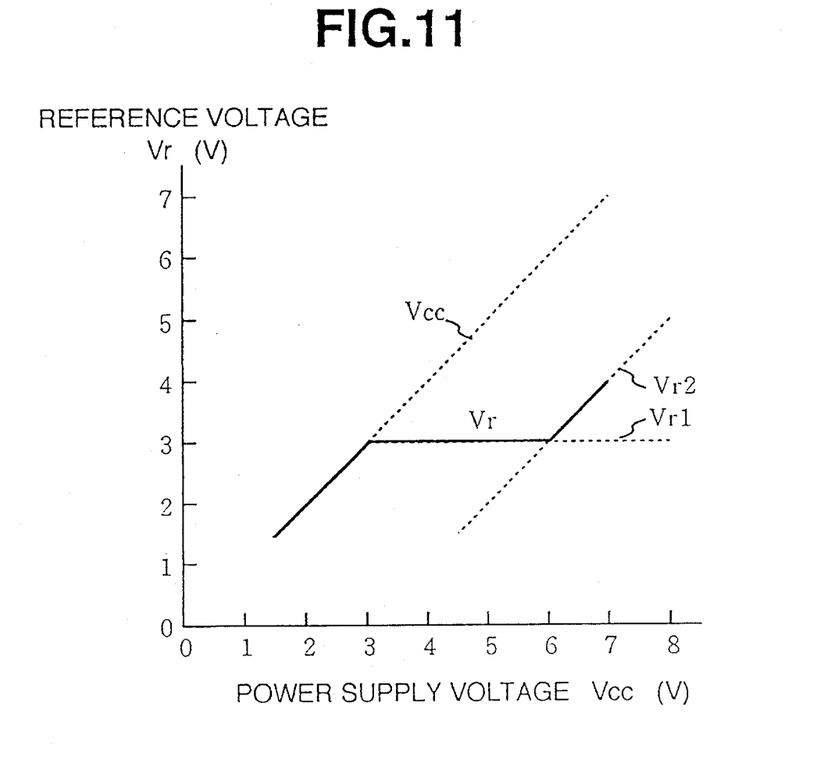
FIG. 11 is a graph showing the relationship between power supply voltage and reference voltage.

On the other hand, the reference voltage Vr2 is a voltage based on the power supply potential. Higher one selected from these reference voltages is outputted as Vr. Referring to FIG. 11, the operation thereof will be described below. In the drawing, the abscissa represents power supply voltage, and the ordinate represents reference voltage Vr. The reference voltage Vr1 which is a voltage based on the ground potential is constant even in the case where the power supply voltage changes as shown in the drawing. On the other hand, the reference voltage Vr2 which is a voltage based on the power supply potential is proportional to the power supply voltage as shown in the drawing. When the power supply voltage is increased, a voltage of the same value as that of the power supply voltage appears first. Then, Vr1 appears. When the power supply voltage is further increased, Vr2 appears. In the case of LSI such as DRAM, it is necessary that LSI is screened for the initial failure of insulating film by applying a higher power supply voltage than the voltage used at the time of the operation thereof. Accordingly, when, for example, the circuit of FIG. 11 is applied to the reference voltage generator VR of FIG. 6, the word line voltage Vch can be generated as a higher voltage Vch+Vr2 than the ordinary voltage Vch+Vr1 so that screening of DRAM can be performed. In this embodiment, not only a higher voltage than the voltage used at the time of the operation can be applied at the time of the screening but screening at an always constant voltage can be performed regardless of the variation of temperature and the variation of manufacturing.

As described above, in this embodiment, a plurality of reference voltages can be generated without increase of any current source and any current-voltage converter. That is, a plurality of reference voltages be generated without increase of consumed electric power.

As described above, in the reference voltage generator according to the present invention, the constant voltage generator for generating a reference voltage operates periodically. Accordingly, the quantity of electric power consumed by the reference voltage generator can be reduced without reduction of the current at the time of the operation of the constant voltage generator. Further, because reduction of the current at the time of the operation of the constant voltage generator for generating a reference voltage is not required, it is unnecessary to increase the resistance values of resistors used in these circuits. Accordingly, the increase of chip size can be suppressed. Further, because the reference voltage generator operates substantially only in the memory cell refresh period, the quantity of electric power consumed by the reference voltage generator is reduced to about 1/300 times compared with the case where the reference voltage generator operates continuously. Accordingly, the time for discharging the battery can be elongated even in the case where DRAM is used in portable equipment.

What is claimed is:

1. A random access memory comprising:
   a first terminal supplied with a first operation potential;
   a second terminal supplied with a second operation potential;
   a plurality of word lines;
   a plurality of data lines disposed so as to intersect said plurality of word lines;
   a plurality of memory cells disposed at desired intersections of said plurality of word lines and said plurality of data lines;
   a decoder for selecting one word line from said plurality of word lines;
   a word line voltage generator supplied with said first and second operation potentials to thereby generate a third operation potential;
   a word line driver for connecting said third operation potential and said one word line selected from said plurality of word lines by said decoder;
   a reference voltage generator supplied with said first and second operation potentials to thereby generate a reference voltage;
   a subtraction circuit for converting the level of a voltage supplied to a word line into a value obtained by subtracting said first operation potential from said voltage supplied to said word line; and
   a comparator for comparing an output voltage of said subtraction circuit and said reference voltage;
   wherein said comparator serves to control said word line voltage generator so that said output voltage of said subtraction circuit and said reference voltage are made substantially equal to each other;
   wherein each of said plurality of memory cells includes an MOS transistor having its gate connected to a corresponding one of said plurality of word lines;
   wherein said reference voltage generator includes:
      a constant voltage generator coupled between said first operation potential and said second operation potential; and
      a voltage sampling means for sampling an output voltage of said constant voltage generator;
   wherein said constant voltage generator includes:
      first and second MOS transistors;
      a first switching means coupled between said first operation potential and said second operation potential so as to be connected in series to respective source-drain paths of said first and second MOS transistors;
      an output terminal for providing the output voltage of said constant voltage generator;
      a voltage-current conversion circuit for converting the difference voltage between the threshold voltage of said first MOS transistor and the threshold voltage of said second MOS transistor into a current proportional to the magnitude of said difference voltage; and
      a current-voltage conversion circuit for converting said proportional current into a voltage proportional to the magnitude of said proportional current and for outputting said proportional voltage as said constant voltage generator output voltage at said output terminal;
   wherein said voltage sampling means includes:
      a second switching means having one end coupled with said output terminal of said constant voltage generator; and
      a first capacitor connected to the other end of said second switching means to thereby store said output voltage of said constant voltage generator; and
   wherein after said first capacitor of said voltage sampling means is charged with said output voltage of said constant voltage generator, said second switching means of said voltage sampling means is turned off and then said first switching means of said constant voltage generator is turned off to thereby reduce a current consumed by said constant voltage generator.

2. A random access memory according to claim 1, wherein:
   said first switching means of said constant voltage generator is turned on periodically; and
   said second switching means of said voltage sampling means is turned on when said first switching means of said constant voltage generator is on, so that said first capacitor of said voltage sampling means restores said first voltage of said constant voltage generator.

3. A random access memory according to claim 2, wherein:
   said voltage sampling means further includes means to output a voltage held by said first capacitor, and
   said output means includes a third MOS transistor having said first capacitor of said voltage sampling means is connected between its gate and its source.

4. A random access memory as claimed in claim 3, wherein said random access memory is a dynamic random access memory.

5. A random access memory according to claim 4 further comprising a refresh control circuit for controlling a refresh period of said plurality of memory cells; and wherein said first switching means is turned on and off in synchronism with the refresh period.

6. A random access memory according to claim 1, wherein:
   said constant voltage generator serves to output, at a second output terminal, a second voltage proportional to a difference between threshold voltages of said first and second MOS transistors; and
   said first voltage and said second voltage are voltages based on said first operation potential.

7. A random access memory according to claim 6, wherein said voltage sampling means further includes:
   a third switching means having one end coupled with said second output terminal of said constant voltage generator;
   a second capacitor for storing said second voltage of said constant voltage generator through said third switching means;

a voltage converting means for converting said first voltage stored in said first capacitor into a third voltage based on said second operation potential; and means for outputting a larger one of said second voltage stored on said second capacitor and said third voltage by reference to said second potential.

8. A random access memory according to claim 7, wherein:

said first switching means of said constant voltage generator is turned on periodically; and said second and third switching means of said voltage sampling means are turned on when said first switching means of said constant voltage generator is on, so that said first and second capacitors of said voltage sampling means restore said first and second voltages of said constant voltage generator respectively.

9. A random access memory according to claim 1, wherein said first voltage of said constant voltage generator is set to a value substantially equal to threshold voltages of MOS transistors in said plurality of memory cells.

10. A random access memory according to claim 1, wherein each of said plurality of memory cells includes a first capacitor having its one end connected to a source or a drain of a corresponding MOS transistor.

* * * * *